(12) United States Patent
Lim et al.

(10) Patent No.: US 8,168,495 B1
(45) Date of Patent: May 1, 2012

(54) CARBON NANOTUBE HIGH FREQUENCY TRANSISTOR TECHNOLOGY

(75) Inventors: Brian Y. Lim, Simi Valley, CA (US); Jon W. Lai, Simi Valley, CA (US)

(73) Assignee: Etamota Corporation, Pasadena, CA (US)

( * ) Notice: Subject to any disclaimer, the term of this patent is extended or adjusted under 35 U.S.C. 154(b) by 1064 days.

(21) Appl. No.: 11/966,693

(22) Filed: Dec. 28, 2007

Related U.S. Application Data

(60) Provisional application No. 60/882,890, filed on Dec. 29, 2006.

(51) Int. Cl.
*H01L 29/72* (2006.01)

(52) U.S. Cl. ........ 438/268; 438/200; 257/236; 977/742; 977/767; 977/938

(58) Field of Classification Search .................. 438/200, 438/268; 257/236; 977/742, 767, 938
See application file for complete search history.

(56) References Cited

U.S. PATENT DOCUMENTS

| | | | |
|---|---|---|---|
| 6,129,901 A | 10/2000 | Moskovits et al. | |
| 6,423,583 B1 | 7/2002 | Avouris et al. | |
| 6,465,813 B2 | 10/2002 | Ihm | |
| 6,566,704 B2 | 5/2003 | Choi et al. | |
| 6,590,231 B2 | 7/2003 | Watanabe et al. | |
| 6,707,098 B2 | 3/2004 | Hofmann et al. | |
| 6,740,910 B2 | 5/2004 | Roesner et al. | |
| 6,759,693 B2 | 7/2004 | Vogeli et al. | |
| 6,798,000 B2 | 9/2004 | Luyken et al. | |
| 6,803,260 B2 * | 10/2004 | Shin et al. | 438/142 |
| 6,809,361 B2 | 10/2004 | Honlein et al. | |
| 6,815,294 B2 | 11/2004 | Choi et al. | |
| 6,830,981 B2 | 12/2004 | Lee et al. | |
| 6,833,567 B2 | 12/2004 | Choi et al. | |
| 6,852,582 B2 | 2/2005 | Wei et al. | |
| 6,855,603 B2 * | 2/2005 | Choi et al. | 438/268 |
| 6,866,891 B2 | 3/2005 | Liebau et al. | |
| 6,891,227 B2 | 5/2005 | Appenzeller et al. | |
| 6,927,982 B2 | 8/2005 | Mergenthaler | |
| 6,995,416 B2 | 2/2006 | Reisinger et al. | |
| 6,998,634 B2 | 2/2006 | Cheong et al. | |
| 7,301,191 B1 | 11/2007 | Tombler | |
| 2001/0019238 A1 | 9/2001 | Dai et al. | |
| 2002/0153160 A1 | 10/2002 | Hofmann et al. | |
| 2002/0173089 A1 | 11/2002 | Zhu | |
| 2003/0148562 A1 | 8/2003 | Luyken et al. | |
| 2003/0155591 A1 | 8/2003 | Kreupl | |
| 2003/0178617 A1 | 9/2003 | Appenzeller et al. | |
| 2003/0179559 A1 | 9/2003 | Engelhardt et al. | |
| 2004/0004235 A1 | 1/2004 | Lee et al. | |

(Continued)

OTHER PUBLICATIONS

Bethune, D.S. et al., "Cobalt-catalysed Growth of Carbon Nanotubes with Single-atomic-layer Walls", Letters to Nature, vol. 363, Jun. 17, 1993, pp. 605-607, Nature Publishing Group.

(Continued)

*Primary Examiner* — Edward Wojciechowicz
(74) *Attorney, Agent, or Firm* — Aka Chan LLP

(57) ABSTRACT

A technique of the invention reduces significantly the distance between the gate and single-walled carbon nanotubes to improve performance and efficiency of a carbon nanotube transistor device. Without using a porous template structure, single-walled carbon nanotubes are grown perpendicularly to a substrate between a base metal layer and a middle mesh layer. The nanotubes are insulated with a thin insulator and then gate regions are formed.

20 Claims, 8 Drawing Sheets

U.S. PATENT DOCUMENTS

| | | |
|---|---|---|
| 2004/0224490 A1 | 11/2004 | Wei et al. |
| 2004/0232426 A1 | 11/2004 | Graham et al. |
| 2004/0233649 A1 | 11/2004 | Honlein et al. |
| 2004/0253741 A1 | 12/2004 | Star et al. |
| 2005/0012163 A1 | 1/2005 | Wei et al. |
| 2005/0029654 A1 | 2/2005 | Mio et al. |
| 2005/0051805 A1 | 3/2005 | Kim et al. |
| 2005/0056826 A1 | 3/2005 | Appenzeller et al. |
| 2005/0095780 A1 | 5/2005 | Gutsche et al. |
| 2005/0145838 A1 | 7/2005 | Furukawa et al. |
| 2005/0156203 A1 | 7/2005 | Bae et al. |
| 2007/0001220 A1 | 1/2007 | Tombler, Jr. |

OTHER PUBLICATIONS

Cassell, Alan M. et al., "Large Scale CVD Synthesis of Single-Walled Carbon Nanotubes", J. Phys. Chem. B, vol. 103, No. 31, 1999, pp. 6484-6492, American Chemical Society.

Choi, Jimsub et al., "Monodisperse Metal Nanowire Arrays on Si by Integration of Template Synthesis with Silicon Technology," Journal of Materials Chemistry, vol. 13, Mar. 2003, pp. 1100-1103.

Choi, Hee Cheul et al., "Efficient Formation of Iron Nanoparticle Catalysts on Silicon Oxide by Hydroxylamine for Carbon Nanotube Synthesis and Electronics", Nano Letters, vol. 3, No. 2, pp. 157-161, Dec. 2002, American Chemical Society.

Choi, Won Bong et al., "Aligned Carbon Nanotubes for Nanoelectroncis", Nanotechnology, vol. 15, pp. S512-S516, 2004, Institute of Physics Publishing Ltd.

Choi, Won Bong et al., "Selective Growth of Carbon Nanotubes for Nanoscale Transistors", Advanced Functional Materials, vol. 13, No. 1, pp. 80-84, Jan. 2003, WILEY-VCH Verlag GmbH & Co. KGaA.

Choi, Won Bong et al., "Ultra-high Density Nanotransistors by Using Selectively Grown Vertical Nanotubes", Applied Physics Letters, vol. 79, No. 22, pp. 3696-3698, Nov. 26, 2001, American Institute of Physics.

Collins, Philip G. et al., "Engineering Carbon Nanotubes and Nanotube Circuits Using Electrical Breakdown", www.sciencemag.org, vol. 292, pp. 706-709, Apr. 27, 2001.

Das, B. et al., "Novel Template-based Semiconductor Nanostructures and their Applications", Applied Physics A—Materials Science & Processing, vol. 71, pp. 681-688, Sep. 13, 2000, Springer-Verlag.

Ebbesen, T.W. et al., "Large-scale Synthesis of Carbon Nanotubes", Letters to Nature, vol. 358, pp. 220-222, Jul. 16, 1992, Nature Publishing Group.

Hamada, Noriaki et al., "New One-Dimensional Conductors: Graphitic Microtubules", Physical Review Letter, vol. 68, No. 10, pp. 1579-1581, Mar. 9, 1992, The American Physical Society.

Iijima, Sumio, "Helical Microtubules of Graphitic Carbon", Letters to Nature, vol. 354, pp. 56-58, Nov. 7, 1991, Nature Publishing Group.

Iijima, Sumio et al., "Single-shell Carbon Nanotubes of 1-nm Diameter", Letters to Nature, vol. 363, pp. 603-605, Jun. 17, 1993, Nature Publishing Group.

Javey, Ali et al., "Ballistic Carbon Nanotube Field-effect Transistors", Letters to Nature, vol. 424, pp. 654-657, Aug. 7, 2003, Nature Publishing Group.

Javey, Ali et al., "Self-Aligned Ballistic Molecular Transistors and Electrically Parallel Nanotube Arrays", Nano Letters, vol. 4, No. 7, pp. 1319-1322, Jun. 23, 2004, American Chemical Society.

Journet, C. et al., "Large-scale Production of Single-walled Carbon Nanotubes by the Electric-arc Technique", Letters to Nature, vol. 388, pp. 756-758, Aug. 21, 1997, Nature Publishing Group.

Kong, Jing et al., "Synthesis of Individual Single-walled Carbon Nanotubes on Patterned Silicon Wafers", Letters to Nature, vol. 395, pp. 878-881, Oct. 29, 1998, Nature Publishing Group.

Krishnan, Ramkumar et al., "Wafer-Level Ordered Arrays of Aligned Carbon Nanotubes with Controlled Size and Spacing on Silicon", Nanotechnology, vol. 16, pp. 841-845, Apr. 11 2005, Institute of Physics Publishing.

Krupke, Ralph et al., "Separation of Metallic from Semiconducting Single-walled Carbon Nanotubes", www.sciencemag.org, vol. 301, pp. 344-347, Jul. 18, 2003.

Kyotani, Takashi et al., "Formation of Ultrafine Carbon Tubes by Using an Anodic Aluminum Oxide Film as a Template", Chemistry of Materials, vol. 7, No. 8, Aug. 1995, American Chemical Society.

Kyotani, Takashi et al., "Preparation of Ultrafine Carbon Tubes in Nanochannels of an Anodic Aluminum Oxide Film", Chemistry of Materials, vol. 8, No. 8, pp. 2109-2113, 1996, American Chemical Society.

Li, Jing et al., "Nanoscale Electroless Metal Deposition in Aligned Carbon Nanotubes", Chemistry of Materials, vol. 10, No. 7, pp. 1963-1967, 1998, American Chemical Society.

Li, Shengdong et al., "Carbon Nanotube Transistor Operation at 2.6 GHz", Nano Letters, vol. 4, No. 4, pp. 753-756. Mar. 23, 2004, American Chemical Society.

Li, Yiming et al., "Growth of Single-walled Carbon Nanotubes from Discrete Catalytic Nanoparticles of Various Sizes", J. Phys. Chem. B, vol. 105, No. 46, pp. 11424-11431, Oct. 31, 2001, American Chemical Society.

Masuda, Hideki et al.,"Ideally Ordered Anodic Porous Alumina Mask Prepared by Imprinting of Vacuum-Evaporated Al on Si", Jpn. J. Appl. Phys., vol. 40, pp. L1267-L1269, Nov. 15, 2001, Japan Society of Applied Physics.

Meng, Guowen et al., "Controlled Fabrication of Hierarchically Branched Nanopores, Nanotubes, and Nanowires", PNAS, vol. 102, No. 20, pp. 7074-7078, May 17, 2005.

Miney, Paul G. et al., "Growth and Characterization of a Porous Aluminum Oxide Film Formed on an Electrically Insulating Support", Electrochemical and Solid-State Letters, vol. 6, pp. B42-B45, Jul. 29, 2003, The Electrochemical Society.

Myung, N.V. et al., "Alumina Nanotemplate Fabrication on Silicon Substrate", Nanotechnology, vol. 15, pp. 833-838, Apr. 26, 2004, Institute of Physics Publishing.

Parthasarathy, Ranjani V. et al., "Template Synthesis of Graphitic Nanotubules", Advanced Materials, vol. 7, No. 11, pp. 896-897, 1995, VCH Verlagsgesellschaft mbH.

Peng, Yong et al., "Magnetic Properties and Magnetization Reversal of $\alpha$-Fe Nanowires Deposited in Alumina Film", Journal of Applied Physics, vol. 87, No. 10, pp. 7405-7408, May 15, 2000, American Institute of Physics.

Seidel, Robert et al., "High-Current Nanotube Transistors", Nano Letters, vol. 4, No. 5, pp. 831-834, Apr. 10, 2004, American Chemical Society.

Seidel, Robert et al., "In-Situ Contacted Single-Walled Carbon Nanotubes and Contact Improvement by Electroless Deposition", Nano Letters, vol. 3, No. 7, pp. 965-968, May 20, 2003, American Chemical Society.

Suh, Jung Sang et al., "Highly Ordered Two-Dimensional Carbon Nanotube Arrays", Applied Physics Letters, vol. 75, No. 14, pp. 2047-2049, Oct. 4, 1999, American Institute of Physics.

Tans, Sander J. et al., "Room-Temperature Transistor Based on a Single Carbon Nanotube", Letters to Nature, vol. 393, pp. 49-52, May 7, 1998, Nature Publishing Group.

Tatarenko N.I. et al., "Geometry and Element Composition of a Nanoscale Field Emission Array Formed by Self-Organization in Porous Anodic Aluminum Oxide", Solid State Electronics, vol. 45, pp. 1009-1016, 2001, Elsevier Science Ltd.

Wu, M.T. et al., "Effect of Polishing Pretreatment on the Fabrication of Ordered Nanopore Arrays on Aluminum Foils by Anodization", J. Vac. Sci. Technol., B 20, pp. 776-782, May/Jun. 2002, American Vacuum Society.

Zheng, Ming et al., "DNA-assisted Dispersion and Separation of Carbon Nanotubes", Nature Materials, vol. 2, pp. 338-342, May 2003, Nature Publishing Group.

Cheng, Guosheng et al., "Current Rectification in a Single GaN Nanowire with a Well-defined p-n Junction," Applied Physics Letters, vol. 83, No. 8, Aug. 25, 2003, pp. 1578-1580.

Gudiksen, Mark S. et al., "Growth of Nanowire Superlattice Structures for Nanoscale Photonics and Electronics," Nature, vol. 415, Feb. 7, 2002, pp. 617-620.

Hu, Jiangtao et al., "Controlled Growth and Electrical Properties of Heterojunctions of Carbon Nanotubes and Silicon Nanowires," Nature, vol. 399, May 6, 1999, pp. 48-51.

Hu, Ping'An et al., "Multiwall Nanotubes with Intramolecular Junctions (CNx/C): Preparation, Rectification, Logic Gates, and Application," Applied Physics Letters, vol. 84, No. 24, Jun. 14, 2004, pp. 4932-4934.

Lee, Jin Seung et al., "Growth of Carbon Nanotubes on Anodic Aluminum Oxide Templates: Fabrication of a Tube-in-Tube and Linearly Joined Tube," Chemical Materials, vol. 13, No. 7, 2001, pp. 2387-2391.

Lee, J.U. et al., "Carbon Nanotube p-n Junction Diodes," Applied Physics Letters, vol. 85, No. 1, Jul. 5, 2004, pp. 145-147.

Li, Meng-Ke et al., "The Synthesis of MWNTs/SWNTs Multiple Phase Nanowire Arrays in Porous Anodic Aluminum Oxide Templates," Materials Science & Engineering, A354, 2003, pp. 92-96.

Suh, Jung Sang et al., "Linearly Joined Carbon Nanotubes," Synthetic Metals, 123, 2001, pp. 381-383.

Wind, S.J. et al., "Vertical Scaling of Carbon Nanotube Field-effect Transistors Using Top Gate Electrodes," Applied Physics Letters, vol. 80, No. 20, May 20, 2002, pp. 3817-3819.

Zhou, Chongwu et al., "Modulated Chemical Doping of Individual Carbon Nanotubes," Science, vol. 290, Nov. 24, 2000, pp. 1552-1555.

Zhang, Yuegang et al., "Electric-Field-Directed Growth of Aligned Single-Walled Carbon Nanotubes," Applied Physics Letters, vol. 79, No. 19, Nov. 5, 2001, pp. 3155-3157.

* cited by examiner

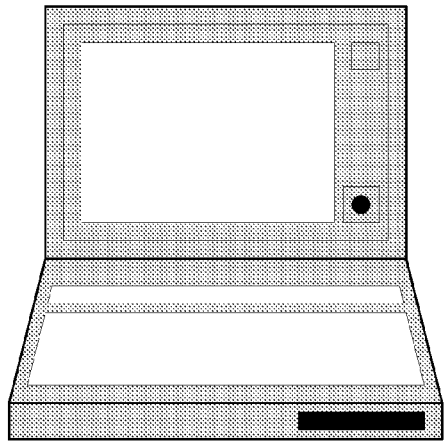
Portable Computer
Figure 1
Figure 2
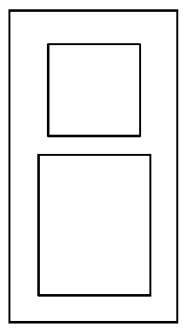
Mobile Phone
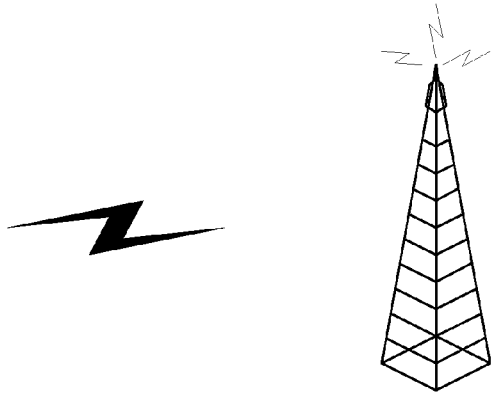
Mobile Phone Network
Base Station
Figure 3

CNTHFT Setup

CNTHFT SWNT Growth

CNTHFT Gate

CNTHFT Tool

Porous Showerhead 1203
Top Metal Mesh 1215
Spacer 1219

Tool used to minimize top and middle mesh from deforming during synthesis.

CARBON NANOTUBE HIGH FREQUENCY TRANSISTOR TECHNOLOGY

CROSS-REFERENCE TO RELATED APPLICATIONS

This application claims the benefit of U.S. provisional patent application 60/882,890, filed Dec. 29, 2006, which is incorporated by reference along with all other references cited in this application. U.S. patent application Ser. No. 11/162,548, filed Sep. 14, 2005, is incorporated by reference.

BACKGROUND OF THE INVENTION

The present invention relates to semiconductor devices and their manufacture, and more specifically to carbon nanotube transistor technology.

The age of information and electronic commerce has been made possible by the development of transistors and electronic circuits, and their miniaturization through integrated circuit technology. Integrated circuits are sometimes referred to as "chips." Many numbers of transistors are used to build electronic circuits and integrated circuits. Modern microprocessor integrated circuits have over 50 million transistors and will have over 1 billion transistors in the future.

Some type of circuits include digital signal processors (DSPs), amplifiers, dynamic random access memories (DRAMs), static random access memories (SRAMs), erasable programmable read only memories (EPROMs), electrically erasable programmable read only memories (EEPROMs), Flash memories, microprocessors, application specific integrated circuits (ASICs), and programmable logic. Other circuits include amplifiers, operational amplifiers, transceivers, power amplifiers, analog switches and multiplexers, oscillators, clocks, filters, power supply and battery management, thermal management, voltage references, comparators, and sensors.

Electronic circuits have been widely adopted and are used in many products in the areas of computers and other programmed machines, consumer electronics, telecommunications and networking equipment, wireless networking and communications, industrial automation, and medical instruments, just to name a few. Electronic circuits and integrated circuits are the foundation of computers, the Internet, voice over IP (VoIP), video on demand (VOD), and on-line technologies including the World Wide Web (WWW).

There is a continuing demand for electronic products that are easier to use, more accessible to greater numbers of users, provide more features, and generally address the needs of consumers and customers. Integrated circuit technology continues to advance rapidly. With new advances in technology, more of these needs are addressed. Furthermore, new advances may also bring about fundamental changes in technology that profoundly impact and greatly enhance the products of the future.

The building blocks in electronics are electrical and electronic elements. These elements include transistors, diodes, resistors, and capacitors. There are many numbers of these elements on a single integrated circuit. Improvements in these elements and the development of new and improved elements will enhance the performance, functionality, and size of the integrated circuit.

An important building block in electronics is the transistor. In fact, the operation of almost every integrated circuit depends on transistors. Transistors are used in the implementation of many circuits. Improving the characteristics and techniques of making transistors will lead to major improvements in electronic and integrated circuit.

Presently silicon-based metal-oxide-semiconductor field-effect transistors (MOSFETs) are the workhorses of electronic systems and power electronics systems. However, demand for increasing performance requirements is pushing the boundaries of silicon material. It is desirable to have transistors with improved characteristics, especially transistors having higher current density, higher thermal conductivity, and higher switching frequency.

Therefore, there is a need to provide improved transistor technology

BRIEF SUMMARY OF THE INVENTION

The present invention relates to transistor devices and associated methods making such devices using carbon nanotube technology. In an embodiment, the transistors include carbon nanotubes and more specifically, single-walled carbon nanotubes (SWNT). A technique of the invention reduces significantly the distance between the gate and single-walled carbon nanotubes to improve performance and efficiency of a carbon nanotube transistor device. Without using a porous template structure, single-walled carbon nanotubes are grown perpendicularly to a substrate between a base metal layer and a middle mesh layer. The nanotubes are insulated with a thin insulator and then gate regions are formed.

In an embodiment, the invention is a method including: providing a substrate; forming a base metal layer on the substrate; forming a catalyst layer on the base metal layer; providing a middle mesh layer, above the catalyst layer and electrically isolated from the base metal layer; providing a top mesh layer, above the middle mesh layer and electrically isolated from the middle mesh layer and base metal layer; applying an electrical potential to create and electric field between the base metal layer and top mesh layer; in the presence of the electric field, forming carbon nanotubes, perpendicular to the substrate, extending from the catalyst layer through the middle mesh layer; forming an insulator layer to insulate the carbon nanotubes, middle mesh layer, catalyst layer, and base metal layer; and forming gate regions between the carbon nanotubes.

The method may include before forming the gate regions, removing undesirable carbon nanotubes. The method may include after forming the gate regions, the method comprises removing undesirable carbon nanotubes. These techniques for removing undesirable carbon nanotubes may be used in conjunction with each other.

Some embodiments of the present invention are especially suited for power transistor or power amplifier applications, or both. Transistors of the invention may be especially suited for a wide range of frequencies, switches, power supplies, and driving motors.

Techniques of the invention may be applicable to diodes, rectifiers, silicon-controlled rectifiers, varistors, thyristors, and related devices. In an embodiment, the invention combines carbon nanotubes and nanowire elements. The devices will allow for high currents, high current densities, and high powers, which are particularly suited for power diodes, power rectifiers, and related applications.

In an implementation, the invention is a method including: forming pores in a template, each pore having a pore diameter; exposing the template having pores to a hydrocarbon gas at a temperature to form a first set of carbon nanotubes in the pores, each carbon nanotube having an outer diameter less than the pore diameter in the template in which the carbon nanotube is produced; forming a first electrode region to electrically connect to first ends of the carbon nanotubes; forming a second electrode region to electrically connect to second ends of the carbon nanotubes; forming first and second trenches in the template; forming a first insulator layer in the first trench; forming a second insulator layer in the second trench; forming a first gate electrode on the first insulator layer in the first trench; forming a second gate electrode on the second insulator layer in the second trench, where between the first and second gate electrodes are at least two carbon nanotubes in the template; creating an electric field between the first electrode region and a region above the first electrode region; and forming a second set of carbon nanotubes above the first electrode region in the presence of the electric field.

In an implementation, the invention is a method including: forming a base metal layer; providing a middle mesh layer, above the catalyst layer and electrically isolated from the base metal layer; providing a top mesh layer, above the middle mesh layer and electrically isolated from the middle mesh layer and base metal layer; applying an electrical potential to create an electric field between the base metal layer and top mesh layer; and in the presence of the electric field, forming carbon nanotubes in the direction of the electric field, extending from the base metal layer through the middle mesh layer.

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIG. 1 shows a computing system incorporating the invention.

FIG. 2 shows a motor vehicle system incorporating the invention.

FIG. 3 shows a telecommunications system incorporating the invention.

DETAILED DESCRIPTION OF THE INVENTION

Figure 4:
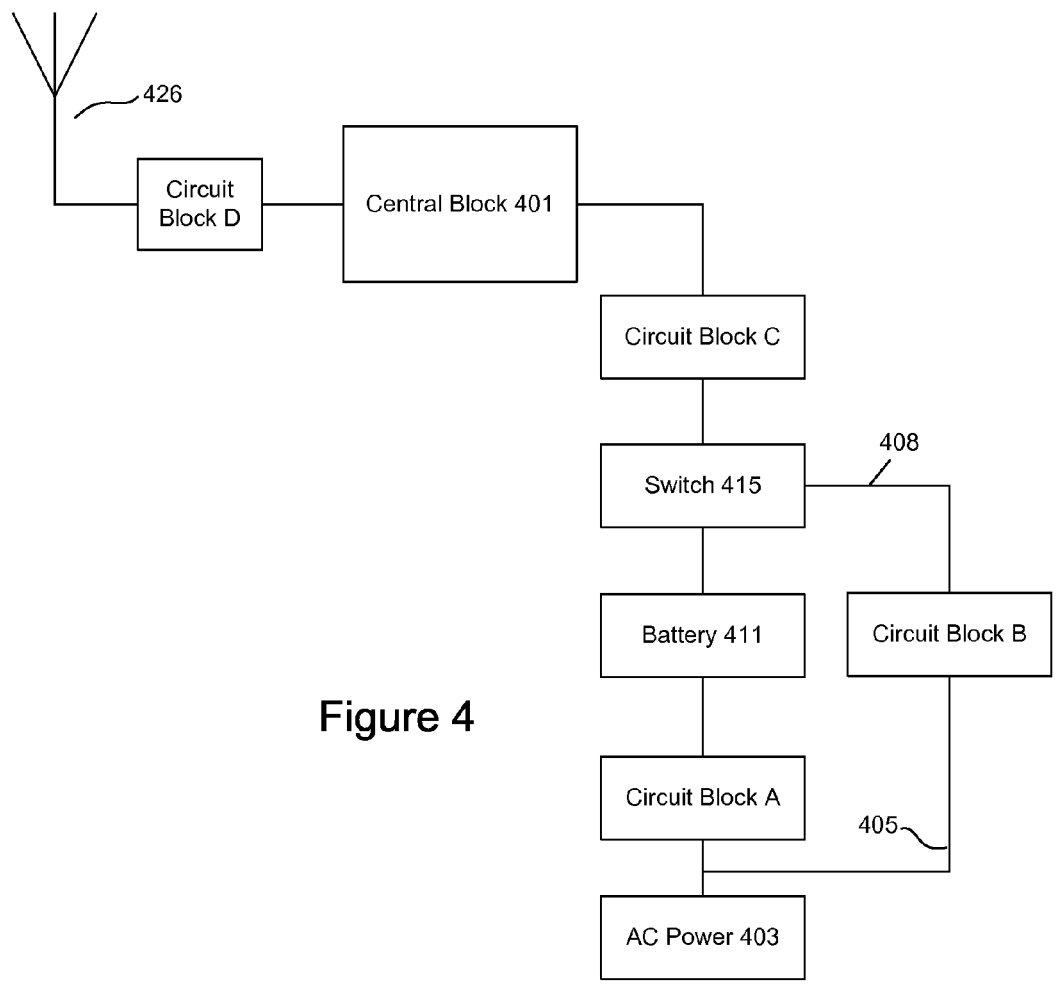
FIG. 4 shows a block diagram of a system incorporating the invention.

The invention provides a carbon nanotube device and techniques for manufacturing such a device, especially a transistor device. In a specific embodiment, the carbon nanotube device is a single-wall carbon nanotube (SWNT) transistor, where the single-walled carbon nanotube is an element of the transistor. A specific application of a single-wall carbon nanotube device of the invention is as a power transistor, a type of transistor capable of passing relatively high currents compared to standard transistors. Carbon nanotube transistors of the invention may be fabricated independently or in combination with devices and with devices of different technologies.

FIG. 1 shows an example of an electronic system incorporating one or more carbon nanotube transistors or rectifying devices of the invention, or combinations of these. Electronic systems come in many different configurations and sizes. Some electronic systems are portable or handheld. Such portable systems typically may be battery operated.

The battery is typically a rechargeable type, such as having nickel cadmium (NiCd), nickel metal hydride (NiMH), lithium ion (Li-Ion), lithium polymer, lead acid, or another rechargeable battery chemistry. The system can operate for a certain amount of time on a single battery charge. After the battery is drained, it may be recharged and then used again.

In a specific embodiment, the electronic system is a portable computing system or computer, such as a laptop or notebook computer. A typical computing system includes a screen, enclosure, and keyboard. There may be a pointing device, touchpad, or mouse equivalent device having one or more buttons. The enclosure houses familiar computer components, some of which are not shown, such as a processor, memory, mass storage devices, battery, wireless transceiver, and the like. Mass storage devices may include mass disk drives, floppy disks, magnetic disks, fixed disks, hard disks, CD-ROM and CD-RW drives, DVD-ROM and DVD-RW drive, Flash and other nonvolatile solid-state storage drives, tape storage, reader, and other similar devices, and combinations of these.

Other examples of portable electronics and battery-operated systems include electronic game machines (e.g., Sony PlayStation Portable), DVD players, personal digital assistants (PDAs), remote controls, mobile phones, remote controlled robots and toys, power tools, still and movie cameras, medical devices, radios and wireless transceivers, and many others. The transistor of the invention may be used in any of these and other electronic and battery-operated systems to provide similar benefits.

Transistors or rectifying devices of the invention, or combinations of these, may be used in various circuits of electronic systems including circuitry for the rapid recharging of the battery cells and voltage conversion, including DC-DC conversion. For example, each laptop power supply typically has eight power transistors. Transistors of the invention may be used in circuitry for driving the screen of the system. The screen may be a flat panel display such as a liquid crystal display (LCD), plasma display, or organic light emitting diode (OLED) display. Transistors of the invention may be used in circuitry for the wireless operation of the system such as circuitry for wireless networking (e.g., Wi-Fi, 802.11a, 802.11b, 802.11g, or 802.11n) or other wireless connectivity (e.g., Bluetooth).

FIG. 2 shows an example of a vehicle incorporating one or more carbon nanotube transistors or rectifying devices of the invention, or combinations of these. Although the figure shows a car example, the vehicle may be a car, automobile, truck, bus, motorized bicycle, scooter, golf cart, train, plane, boat, ship, submarine, wheelchairs, personal transportations devices (e.g., Segway Human Transporter (HT)), or other. In a specific embodiment, the vehicle is an electric vehicle or hybrid-electric vehicle, whose motion or operation is provided, at least in part, by electric motors.

In an electric vehicle, rechargeable batteries, typically lead acid, drive the electric motors. These electric or hybrid-electric vehicles include transistors or devices of the invention in, among other places, the recharging circuitry used to recharge the batteries. For a hybrid-electric vehicle, the battery is recharged by the motion of the vehicle. For a fully electric vehicle, the battery is charged via an external source, such as an AC line or another connection to a power grid or electrical power generator source. The vehicular systems may also include circuitry with transistors of the invention to operate their on-board electronics and electrical systems.

FIG. 3 shows an example of a telecommunications system incorporating one or more carbon nanotube transistors or rectifying devices of the invention, or combinations of these. The telecommunications system has one or more mobile phones and one or more mobile phone network base stations. As described above for portable electronic devices, each mobile phone typically has a rechargeable battery that may be charged using circuitry with transistors or devices of the invention. Furthermore, for the mobile phone or other wireless device, there may be transceiver or wireless broadcasting circuitry implemented using transistors of the invention. And a mobile phone network base station may have transceiver or broadcasting circuitry with transistors or devices of the invention.

FIG. 4 shows a more detailed block diagram of a representative system incorporating the invention. This is an exemplary system representative of an electronic device, notebook computer, vehicle, telecommunications network, or other system incorporating the invention as discussed above. The system has a central block 401, a component of the system receiving power. The central block may be a central processing unit, microprocessor, memory, amplifier, electric motor, display, or other.

DC power is supplied to the central block from a rechargeable battery 411. This battery is charged from an AC power source 403 using a circuit block A including carbon nanotube transistors or devices of the invention. Circuit block A may include circuitry to convert AC power to DC power, and this circuitry may also include carbon nanotube transistors or rectifying devices. Although a single circuit block A is shown to simplify the diagram, the circuitry may be divided into two circuit blocks, one block for AC-to-DC conversion and another block for the recharging circuitry.

Central block may be a device that can be powered either by the AC line or from the battery. In such an embodiment, there would be a path from AC power, connection 405, circuit block B, and connection 408 to a switch 415. The battery is also connected to switch 415. The switch selects whether power is supplied to the central block from the battery or from the AC power line (via circuit block B). Circuit block B may include AC-to-DC conversion circuitry implemented using carbon nanotube transistors or devices of the invention. Furthermore, in an implementation of the invention, switch 415 includes carbon nanotube transistors or devices of the invention.

Circuit block B may be incorporated into a power supply for central block. This power supply may be switching or linear power supply. With carbon nanotube transistors of the invention, the power supply will be able to provide more power in a more compact form factor than using typical transistors. The power supply of the invention would also generate less heat, so there is less likelihood of overheating or fire. Also, a fan for the power supply may not be necessary, so a system incorporating a power supply having nanotube transistors of the invention may be quieter.

The path from AC power through circuit block B is optional. This path is not needed in the case there is not an option to supply power from an AC line to the central block. In such a case, switch 415 would also not be used, and battery 411 would directly connect to circuit block C. As can be appreciated, there are many variations to how the circuitry of the system in the figure may be interconnected, and these variations would not depart from the scope of the invention.

Circuit block C is circuitry such as a DC-to-DC power converter or voltage regulator including carbon nanotube transistors or devices of the invention. This circuitry takes DC power of a certain voltage and converts it to DC voltage at a different voltage level. For example, the battery or output of circuit block B may have an output voltage of about 7.2 volts, but the central block uses 3 volts. Circuit block C converts the 7.2 volts to 3 volts. This would be a step-down converter since voltage of a higher level is being converted to a lower level.

In the case central block 401 has a wireless component, a path including circuit block D and antenna 426 will be used to transmit and receive wireless signals. Circuit block includes carbon nanotube transistors of the invention to perform the signal transmission or reception. For example, the carbon nanotube transistors may be used as output devices in an amplifier generating the wireless signal. In an implementation of the invention without a wireless component, then circuit block D and the antenna would not be present.

Figure 5:
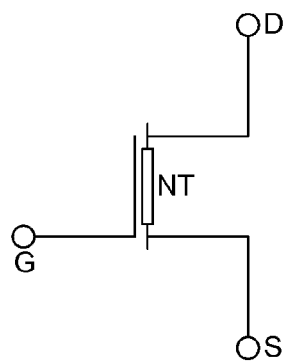
FIG. 5 shows a circuit symbol for a carbon nanotube transistor.

FIG. 5 shows a symbol of a carbon nanotube transistor of the invention. According to the invention, transistors are manufactured using carbon nanotubes (CNTs). And more specifically, field-effect transistors (FETs) are manufactured using single-walled carbon nanotubes. The transistor has a gate node G, drain node D, and source node S. This carbon nanotube transistor of the invention does not have a bulk, substrate, or well node as would a typical MOS transistor of an integrated circuit. In other embodiments of the invention, the carbon nanotube transistor may have a bulk node.

When an appropriate voltage is applied to the gate node, a channel can form in a carbon nanotube, denoted by NT. Current can flow from drain to source. Operation of the single-walled carbon nanotube transistor of the invention is analogous to a metal oxide semiconductor (MOS) transistor.

The single-walled carbon nanotube is a relatively recently discovered material. A single-walled carbon nanotube can be conceptually described as a single sheet of graphite (also called graphene) that is configured into a seamless cylindrical roll with diameters typically about 1 nanometer, but can range from about 0.4 to about 5 nanometers. The cylinder may be a one-layer thick layer. For example, a nanotube may be 0.5, 0.7, 0.8, 0.9, 1.0, 1.1, 1.2, 1.3, 1.6, 2, 2.5, 2.7, 3, 3.2, 3.6, 3.8, 4.0, 4.2, 4.3, 4.5, 4.6, 4.7, or 4.9 nanometers. Depending on the process technology, single-walled carbon nanotubes may have diameters less than 0.7 nanometers or greater than 5 nanometers.

In addition to single-walled carbon nanotubes, another type of carbon nanotube is a multiwalled carbon nanotube (MWNT). A multiwalled carbon nanotube is different from single-walled carbon nanotube. Instead of a single carbon nanotube cylinder, multiwalled carbon nanotubes have concentric cylinders of carbon nanotubes. Consequently, multiwalled carbon nanotubes are thicker, typically having diameters of about 5 nanometers and greater. For example, multiwalled carbon nanotubes may have diameters of 6, 7, 8, 10, 11, 15, 20, 30, 32, 36, 50, 56, 62, 74, 78, 86, 90, 96, or 100 nanometers, or even larger diameters.

Single-walled carbon nanotubes have unique electrical, thermal, and mechanical properties. Electronically they can be metallic or semiconducting based on their chirality or helicity, which is determined by their (n, m) designation, which can be thought of as how the graphite sheet is rolled into a cylinder. Typically, individual single-walled carbon nanotubes can handle currents of 20 microamps and greater without damage. Compared to multiwalled carbon nanotubes, single-walled carbon nanotubes generally do not have structural defects, which is significant for electronics applications.

Single-walled carbon nanotube material has proven to have incredible materials properties. It is the strongest known material—about 150 times stronger than steel. It has the highest known thermal conductivity (about 6000 watts per meter per degree Kelvin). The properties of semiconducting single-walled carbon nanotubes are indeed promising. They may be used in field-effect transistors (FETs), nonvolatile memory, logic circuits, and other applications.

With regard to transistor applications, single-walled nanotube devices have "on" resistances and switching resistances that are significantly lower than those of silicon. Transistors based on single-walled carbon nanotube technology can handle considerably higher current loads without getting as hot as conventional silicon devices. This key advantage is based on two factors. First, the lower "on" resistance and more efficient switching results in much lower heat generation. Second, single-walled carbon nanotubes have high thermal conductivity ensures that the heat does not build up.

Important considerations in carbon nanotube field effect transistor (CNTFET) design and fabrication are threefold. A first consideration is the controlled and reproducible growth of high quality single-walled carbon nanotubes with the desirable diameter, length, and chirality. A second consideration is the efficient integration of nanotubes into electronic structures. And a third consideration is current nanotube growth and device fabrication processes need to be improved significantly so that they are amenable to scalable and economical manufacturing.

Figure 6:
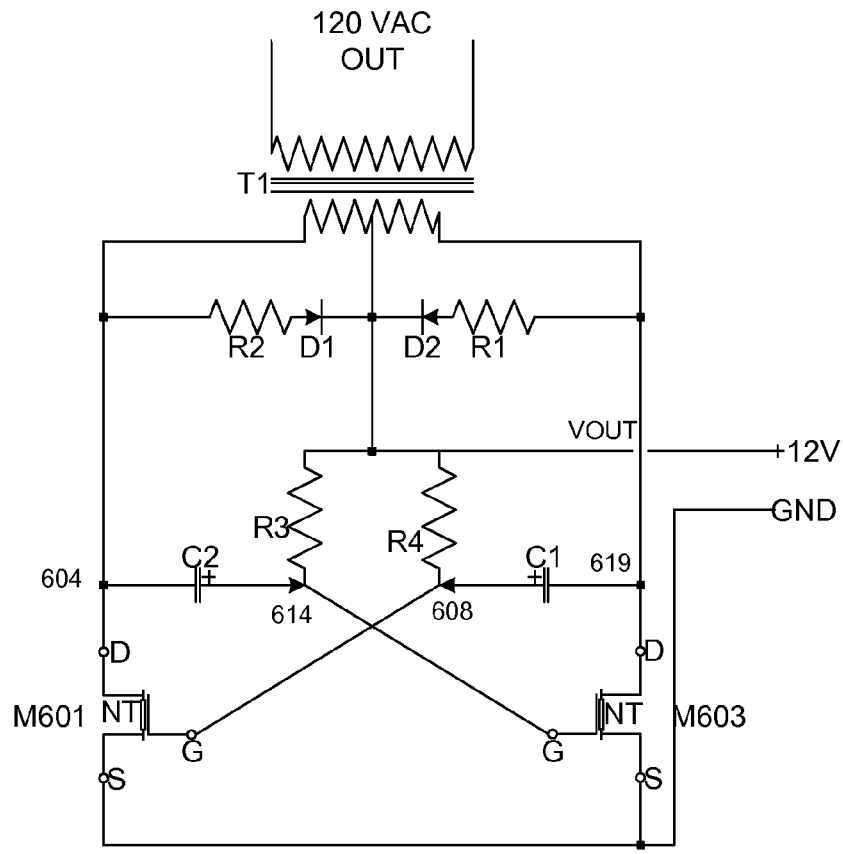
FIG. 6 shows a DC-to-AC inverter circuit using carbon nanotube transistors.

FIG. 6 shows an AC-to-DC converter circuit using two carbon nanotube transistors, M601 and M603, of the invention. The circuitry takes an AC voltage input, such as 120 volts provided at transformer T1 and provides a DC voltage output, such as the 12 volts indicated in the figure. The converter may be designed to take as input any AC voltage, but 120 volts was selected since this is the standard AC line voltage in the U.S. The circuitry may be designed to output any desired DC voltage, less than or more than 12 volts, such as 2 volts, 3, volts, 5 volts, 6 volts, 16 volts, 18 volts, or 20 volts, by varying the circuit components. For example, the resistances R1, R2, R3, and R4 may be varied.

Single-walled carbon nanotube transistor M601 is connected between a node 604 and ground. A gate node of M601 is connected to node 608. A capacitor C2 is connected between 604 and 614, which is connected to a gate of single-walled carbon nanotube transistor M603. M603 is connected between node 619 and ground. A capacitor C1 is connected between 608 and 619. Resistor R3 is connected between DC output, VOUT, and 614. Resistor R4 is connected between VOUT and 608. Between VOUT and 604 are a diode D1 and resistor R2. Between VOUT and 619 are a diode D2 and resistor R1. Nodes 604 and 619 are connected to windings of transformer T1.

The AC-to-DC converter may output significant currents because the converter provides power for circuits having relatively large power needs. Therefore, in such cases, carbon nanotube transistors M601 and M603 will pass relatively large currents. In addition, in a battery recharging battery application, by increasing the current M601 and M603 can pass without overheating or damaging the devices, this will speed-up the rate at which batteries may be recharged.

Figure 7:
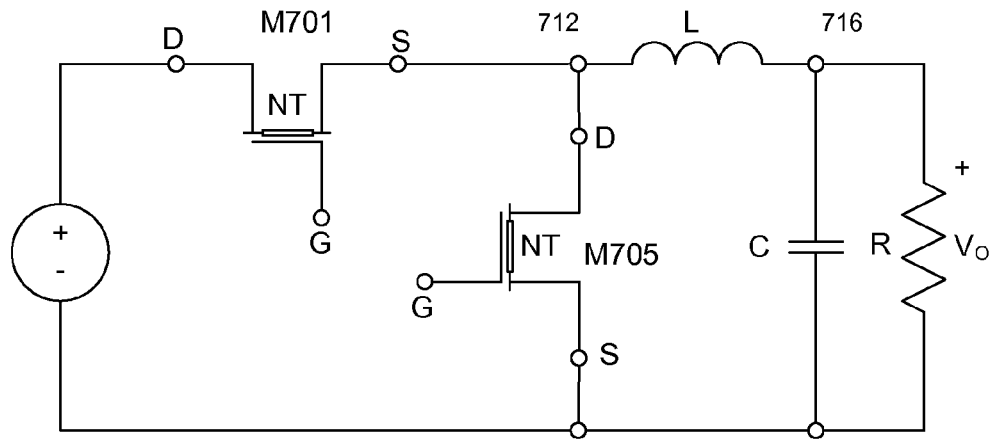
FIG. 7 shows a DC-DC converter circuit using carbon nanotube transistors.

FIG. 7 shows a DC-to-DC converter circuit using two carbon nanotube transistors, M701 and M705, of the invention. The circuit takes a DC input voltage, VIN, and outputs a different DC voltage, VO. For example, VIN may be 7.2 volts or 12 volts, and VO may be 5 volts or 3 volts. Voltage conversion is used in many applications such as portable electronics because batteries may not provide output at a desired voltage level or at a voltage compatible with electronics.

This circuit may also be part of a DC inverter circuit, in which case a voltage output of opposite polarity to the input voltage is provided. For example, if the input voltage is positive, the output voltage of the inverter would be negative. Or if the input voltage is negative, the output voltage of the inverter would be positive.

Single-walled carbon nanotube transistor M701 is connected between VIN+ and node 712. Single-walled carbon nanotube transistor M705 is connected between node 712 and VIN− (or ground). An inductor L is connected between 712 and 716. A capacitor and resistor are connected between 716 and VIN−. An output VO is taken between node 716 and ground.

In a further embodiment of the invention, there may be a first diode connected between a drain and source of transistor M701, and a second diode connected between a drain and source of transistor M705. The first diode may be connected so that current will be allowed to flow in a direction from node 712 to VIN+. The second diode may be connected so that current will be allowed to flow in a direction from ground to node 712.

These diodes may be designed or fabricated using any technique used to obtain devices with diode characteristics including using a diode-connected transistor, where a gate and drain of the transistor are connected together, or other transistor techniques. In another embodiment, a diode may be integrated with a nanotube transistor using a single-walled carbon nanotube and nanowire junction or other junction as is discussed in U.S. patent application Ser. No. 11/162,548, filed Sep. 14, 2005, which is incorporated by reference.

In operation, the converter circuit converts the VIN voltage to a VO or VOUT voltage. A first signal is connected to a gate of transistor M701, and a second signal is connected to a gate of transistor M705. The first and second signals may clock signals or oscillator signals including square waves, pulse trains, sawtooth signals, and the like. The first and second signals and may be generated by a controller for the converter circuit.

Power transistors are high power output stages in electronics that typically carry high currents and power. They are elements in power amplifiers and are used to deliver required amounts of current and power efficiently to a load. Applications include power delivery to devices within integrated circuits, personal computers, cellular phones, wireless base stations, and a variety of electrical devices. Power transistors are also used for high current switches and supplying power to motors.

At the present time, power transistors are bipolar junction transistors (BJT) or metal oxide semiconductor field-effect transistors (MOSFET) based on silicon technology. In addition to these silicon-based devices, other materials are used such as gallium arsenide and gallium nitride. However, silicon bipolar junction transistors and silicon metal oxide semiconductor field-effect transistors, specifically laterally diffused metal oxide semiconductor, dominate the field. The entire power transistor device contains a multitude of linked individual transistors in order to distribute the total current and power. Relevant parameters in power transistors include current carrying and power capability, current gain, efficiency, and thermal resistance.

There are a number of challenges to commercialization of carbon nanotube transistors and replacing current semiconductor technologies, including chirality control, location and orientation control, size and length control, and overall quality control of the properties of single-walled carbon nanotubes on a large scale. These are addressed by the present invention.

Figure 8:
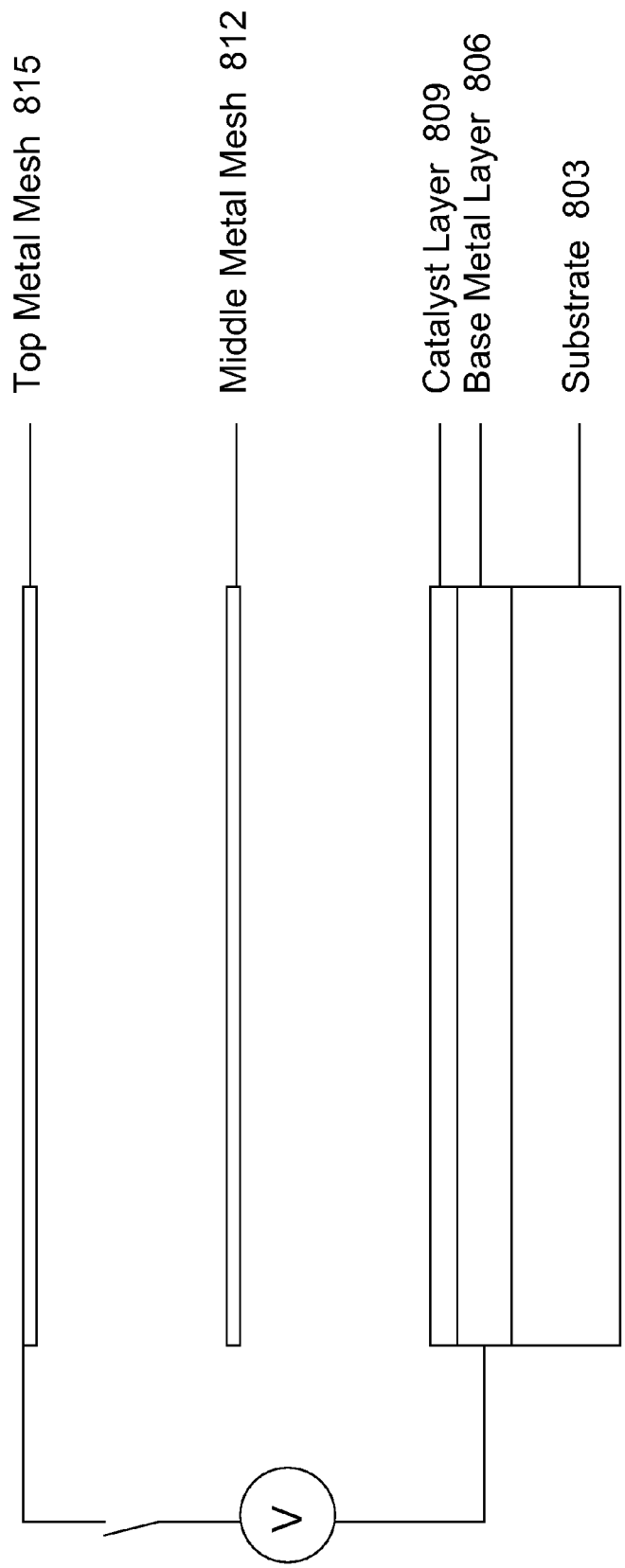
FIG. 8 shows a setup for fabricating a carbon nanotube high frequency transistor.

In an embodiment, the invention is a carbon nanotube high frequency transistor (CNTHFT) and a process for making such a transistor. FIG. 8 shows a setup for fabricating a carbon nanotube high frequency transistor. The setup includes a substrate 803. A base metal layer 806 is formed on the substrate, and a catalyst 809 layer is formed on the base metal layer. The base metal and catalyst layers may be formed on the substrate using a technique such as atomic layer deposition (ALD), sputtering, e-beam deposition, or other methods.

The substrate and base metal can be solid or porous. The catalyst may be thin film or nanoparticles. In some processes, the catalyst layer is optional and is not present. The substrate may be any suitable material. In some processes, the substrate and the base metal layer may be the same material or same layer. Some substrate materials include aluminum oxide, silicon, silicon germanium, gallium nitride, germanium, gallium arsenide, plastic, polymer, glass, or quartz, or the like, or a combination of these. The metal base layer may be a material such as gold, titanium, palladium, platinum, aluminum, or other metal.

The catalyst used in forming carbon nanotubes may include iron, nickel, or cobalt, or any combination of these metals, or any combination of one or more of these with other metals. Typically the catalyst is in the form of nanoparticles that is the appropriate size, usually 1 nanometer to 4 nanometers in diameter. In other implementations, the catalyst may be larger than 4 nanometers. These nanoparticles may be obtained through metal deposition such as by metal evaporators, electrochemical deposition of metals, or a wet deposition of catalyst where the metal catalyst nanoparticle or particles is supported by a larger inorganic support or an organic shell, such as a ferritin protein. Above the substrate, base metal, and catalyst structure is a middle mesh layer 812. Above the middle mesh layer is a top mesh layer 815.

In an implementation, the top and middle mesh layers are the same material, but in other implementations, the top and middle mesh layers are different materials. In an implementation, a mesh layer is a relatively thin conductive layer that is porous, has spaces, or otherwise has openings. Examples of various meshes include a conductive net, conductive fabric, porous template, porous alumina, material with interlocking links, web, and others. The top and middle mesh layers may have the same thickness or different thicknesses. For example, the top mesh layer may be relatively thin, while the middle mesh layer is a thicker layer. The middle mesh layer may be a porous template (e.g., alumina). The top and middle mesh layers have different densities of openings. For example, the top mesh layer may have greater number of openings than the middle mesh layer, or vice versa.

This invention is described with respect to the orientation shown in the figures. However, the invention may be oriented as desired to facilitate and enhance manufacturability. For example, in alternative embodiments, the orientation of the substrate and layers may be flipped (i.e., 180 degrees), rotated (e.g., 35, 45, 60, 75, or 90 degrees). If the structure is flipped, the "top" mesh layer may become the "bottom" mesh layer.

The base metal layer on the substrate is separated from the two metal mesh layers with insulators. The middle metal mesh layer is electrically insulated from the top metal mesh layer and base metal layer on the substrate. The top and middle mesh layers may be formed by a technique such as atomic layer deposition, sputtering, e-beam deposition, or other methods. In an implementation, the mesh layers are conductive materials, such as metal (e.g., copper, aluminum, gold, steel, iron, tungsten, or titanium, and alloys and combinations of these) and other materials.

A voltage potential V is applied to the top mesh layer and base metal layers, which act as electrodes. This voltage potential generates an electric field between the two layers, which will cause the vertical alignment of carbon nanotubes during their synthesis. Synthesis may be by chemical vapor deposition. The voltage potential may be any voltage, such as 0.5, 0.6, 0.7, 0.8, 1, 2, 3, 4, 5, 6, 7, 8, 9, 10, 11, 12, 13, 14, 15, 16, 17, 18, 19, 20, 21, 22, 25, or 50 volts or greater. In an implementation, the voltage applied may be up to 200 volts, 300 volts, and 500 volts. The voltage may be direct current (DC) or alternating current (AC). Generally, the greater the voltage difference, the greater the electric field. For example, the electric field may be in ranges such as from 0.1 to 2 volts per micron and from 0.1 to 0.25 volts per micron. In some embodiments, the field may exceed 3 volts per micron, 4 volts per micron, or 5 volts per micron.

Figure 9:
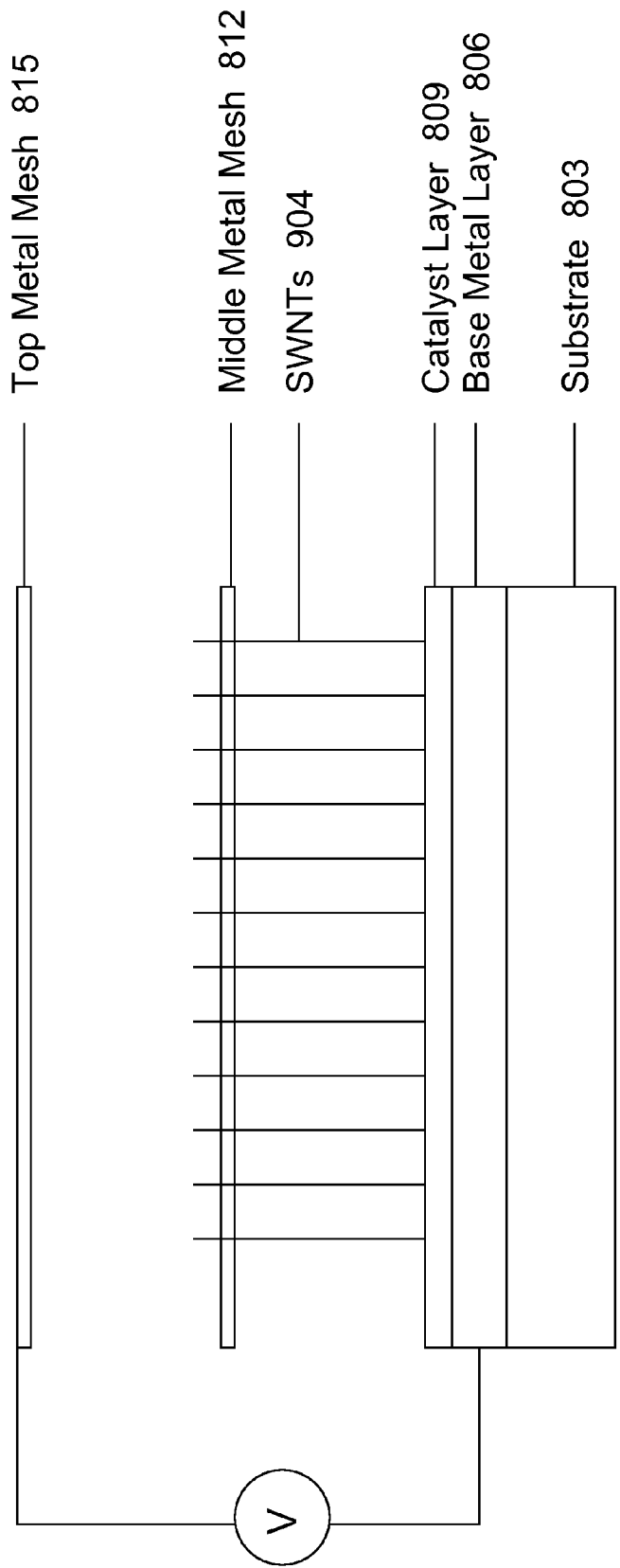
FIG. 9 shows synthesis of carbon nanotubes for the carbon nanotube high frequency transistor.

FIG. 9 shows synthesis of carbon nanotubes for the carbon nanotube high frequency transistor. In a specific implementation, the single-walled carbon nanotubes are grown vertically, perpendicular to the substrate, using a chemical vapor deposition method with an electric field. The voltage potential difference, discussed above) applied between the base metal layer and top mesh layer creates the electric field. In an implementation, the middle mesh is not connected to a voltage source or potential, but is left floating.

As shown, single-walled carbon nanotubes 904 are grown past the middle metal mesh layer and make contact with it. In an implementation, the nanotubes extend through openings in the mesh (e.g., similar to a situation where hair follicles stand on end and extend through a wire screen). The middle mesh layer will become one of the electrodes (e.g., source electrode) of the transistor. The base metal layer will become another electrode (e.g., drain electrode) of the transistor.

In another implementation, the middle mesh layer is not conductive, and a conductive layer is added above the middle mesh layer. This conductive layer is added above the middle mesh layer will be an electrode for the carbon nanotubes.

The direction that the carbon nanotubes are grown will in the direction of the electric field. So, when the electric field is in a direction from base metal layer to the top mesh layer, the nanotubes will generally be in a perpendicular or approximately perpendicular direction to the base metal layer. However, by position the top mesh layer or electric field as desired, the direction or orientation of the nanotubes can be changed as desired. For example, it may be desirable not to have the nanotubes exactly at 90 degrees (e.g., 89.9, 89.8, 89.7, 89.6, 89.5, 89.4, 89, 88, 87, 86, 85, 84, 83, 82, 81, or 80 degrees) to the base metal layer surface. Then the electric field may be shifted slightly to do this. Based on the electric field orientation to the base metal layer, the angle between the nanotubes and surface may be adjusted to any desirable angle, such as 10, 15, 25, 35, 45, 60, 65, 75, 78, 85, or 90 degrees. Further, on one portion of the device, nanotubes may have one orientation, while nanotubes at another portion of the substrate have another orientation. In fact, using two different electric in separate process steps, two different portions of the same device may have nanotubes perpendicular to each other. Even within the same device, there may be slight variations in the angles of different nanotubes due to vibration of the nanotubes when subjected to the electric field.

After the nanotubes are grown but before the gate regions are formed, the metallic single-walled carbon nanotubes (or other undesirable carbon nanotubes) may be reduced or removed using a technique such as plasma, electrical burn off, chemical methods, or others, or a combination of these. The undesirable carbon nanotubes may include multiwalled carbon nanotubes. Further description on the formation of single-walled carbon nanotubes and burn off techniques may be found U.S. patent application Ser. No. 11/162,548.

In an implementation, the single-walled carbon nanotubes are synthesized or grown in the electric field on the catalyst layer. In an implementation, single-walled carbon nanotubes are synthesized before incorporation into the nanotube device. The single-walled carbon nanotubes are synthesized beforehand in bulk by any competent method such as CVD, arc-discharge, laser ablation method, or the like, or combinations of these, or any other method. Then the carbon nanotubes are transferred in structure in the figure. The transfer method of single-walled carbon nanotube placement can use any competent method. For example, an approach flows a solution or suspension containing single-walled carbon nanotubes such that it leaves single-walled carbon nanotubes with the ability to contact each side with metal electrodes.

Any unwanted or extraneous single-walled carbon nanotubes or portions of single-walled carbon nanotubes are removed by any competent method such as chemical, electrical, or mechanical methods, or the like.

While in solution, the single-walled carbon nanotubes can further be separated to enrich the semiconducting content and optimize the length and diameter. For example, the single-walled carbon nanotubes may be separated by size, length, or electrical characteristics. In one implementation, semiconducting single-walled carbon nanotubes are separated from metallic single-walled carbon nanotubes. Therefore, using this approach, it is possible to get a higher concentration of semiconducting single-walled carbon nanotubes than is possible by synthesis alone. The solution or suspension can also be optimized for single-walled carbon nanotubes of a desired diameter and length. The diameter of the single-walled carbon nanotube will determine the semiconducting band gap size. The length of the single-walled carbon nanotubes should be at least as long to extend a distance from the base metal layer through the middle mesh layer.

Another approach for removing unwanted or undesirable nanotubes is to burn off such nanotubes after the nanotube device is fabricated. Voltages are applied to the source, drain, and gate electrodes in such a way that undesirable nanotubes are burned or otherwise rendered ineffective (e.g., sufficient current flows so that undesirable nanotubes destroy themselves, becoming disconnected or an open circuit), while the desirable nanotubes (i.e., single-walled nonmetallic carbon nanotubes) remain.

Figure 10:
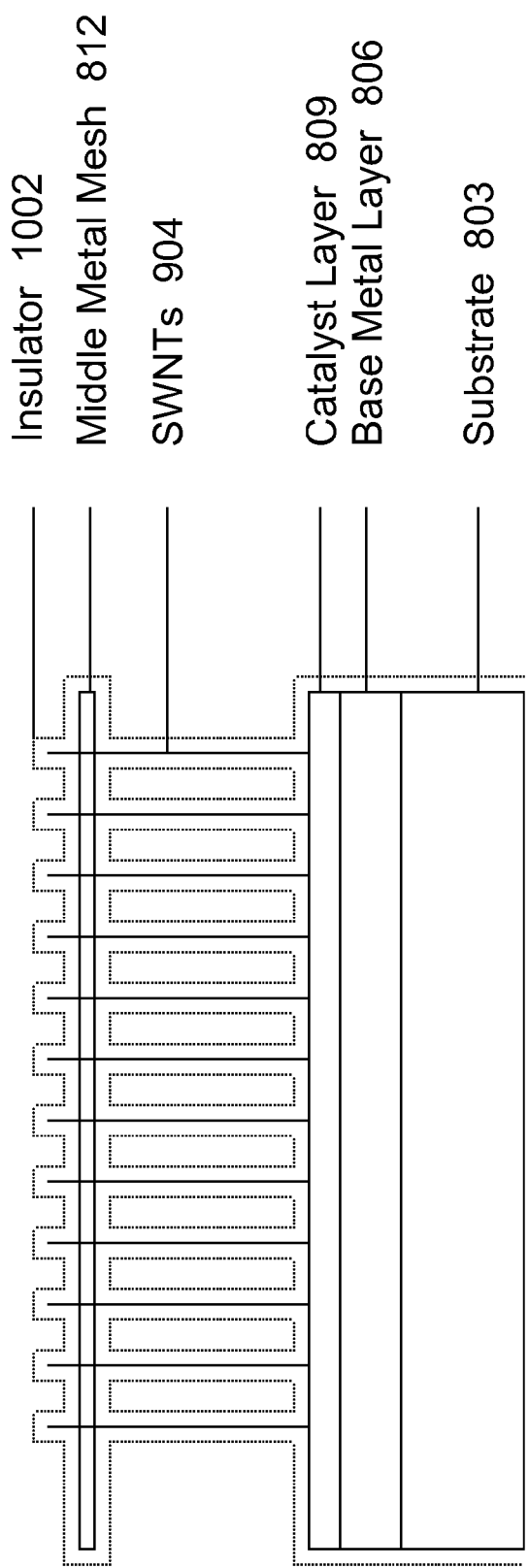
FIG. 10 shows forming an insulator for the carbon nanotube high frequency transistor.

FIG. 10 shows forming an insulator 1002 for the high frequency transistor. The insulator insulates the carbon nanotubes, metal mesh layer, and base metal-substrate structure. The insulator may be an insulator material (e.g., silicon oxide or silicon nitride), metal oxide (e.g., aluminum oxide or titanium oxide), nonconducting material, synthetic or natural polymer (e.g., plastic, cellulose, nitrocellulose, polycarbonate, polystyrene, polyethylene, polypropylene, polyvinyl chloride, or polyethylene terephthalate), or other material (e.g., air, nitrogen, oxygen, oil, or other gases or fluids), or combinations of these. This insulator may be formed by a technique such as atomic layer deposition, PECVD deposition, or others, or combinations or these.

In a process of making a device of the invention, the insulator is formed after the nanotubes are synthesized. As discussed above, the undesirable nanotubes may be removed before the insulator is formed, or after, such as when a burn-off approach is used.

Figure 11:
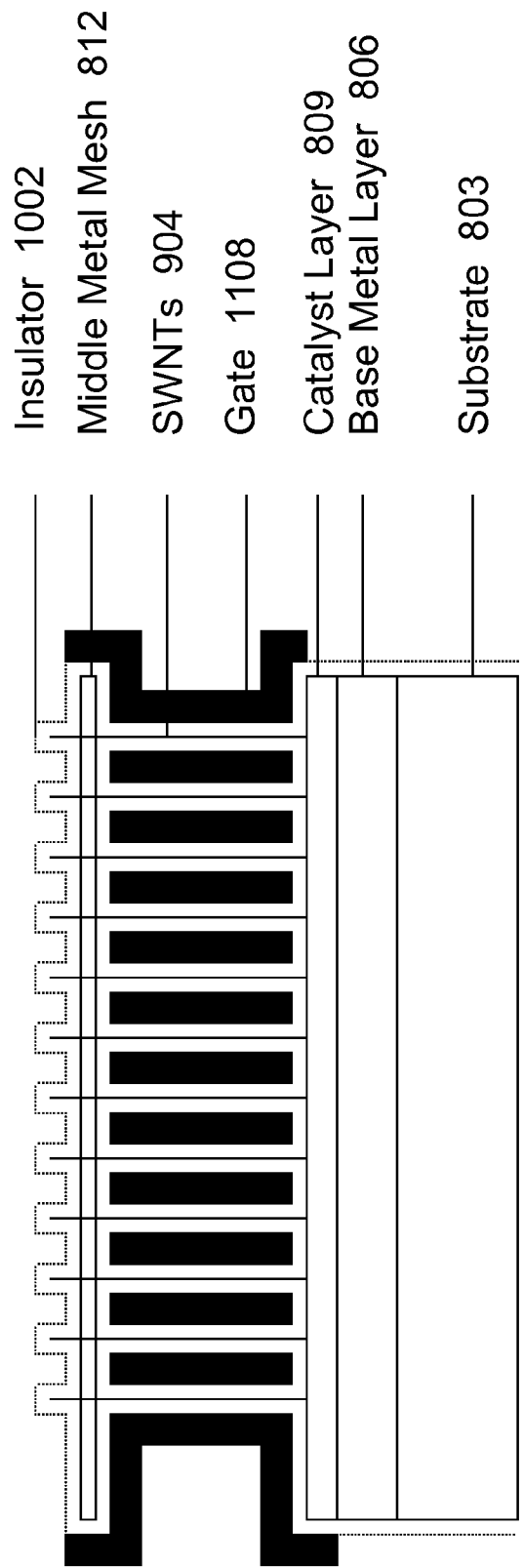
FIG. 11 shows forming a gate for the carbon nanotube high frequency transistor.

FIG. 11 shows forming a gate 1108 for the carbon nanotube high frequency transistor. Gate regions are formed between the nanotubes. The gate regions may be formed by a technique such as atomic layer deposition, sputtering, e-beam deposition, or other methods. The gate region may be formed using a metal (e.g., aluminum), polysilicon, polysilicide, or another conductive material.

After the gates are formed, the metallic single-walled carbon nanotubes (or other undesirable carbon nanotubes) may be reduced or removed using high current while effectively gating semiconducting single-walled carbon nanotubes. The high current does not pass through the desirable nanotubes, leaving them intact. Other related or similar methods may be used to burn off the undesirable nanotubes.

A previous technique for manufacturing vertical carbon nanotubes included using a porous alumina structure. See U.S. patent application Ser. No. 11/162,548 for a detailed discussion. That approach includes integrating a gate by etching into the alumina substrate. Typically, etching into the alumina substrates results in a more significant separation of the gate from the semiconducting single-walled carbon nanotubes. This separation results in lower efficiency and reduced performance of gate in switching the semiconducting single-walled carbon nanotubes.

With an electric-field-directed nanotube growth, the process may be used in low or zero gravity environments, such as in space. Further, the approach described in this application of using an electric field in the formation or synthesis of the nanotubes may be used in conjunction with a porous template approach, such as the approach described in U.S. patent application Ser. No. 11/162,548.

For example, a layer of nanotubes may be formed according to the porous template approach. Then a base metal layer formed on that nanotube structure (e.g., formed on one or more nanotube transistors). On the base metal, the electric field approach described in this application is used to form a second layer of nanotube transistors on top of the porous structure with nanotubes. In an implementation, the base metal may be electrically the same as the bottom electrode of the higher level nanotube device or devices. This approach allows the fabrication of multilevel or multilayer nanotube devices, and devices of two or more layers are interconnected as desired. For example, a very wide (e.g., large width) transistor with many numbers of nanotubes on two different layers may be formed; this transistor will be able to handle larger currents.

The present invention significantly reduces the distance between the gate and the semiconducting single-walled carbon nanotubes with thin layer deposition of insulator then gate directly on the semiconducting single-walled carbon nanotubes. This results in greater density of nanotubes (compared to other approaches), so greater numbers of nanotubes may be formed per unit area. The transistor of the invention will have faster switching, higher frequency of operation, and greater efficiency of device, relative to devices with lower nanotube density. Such higher performance devices will enable creation of carbon nanotube transistor products for the communications and others industries with very high performance and efficiency.

Figure 12:
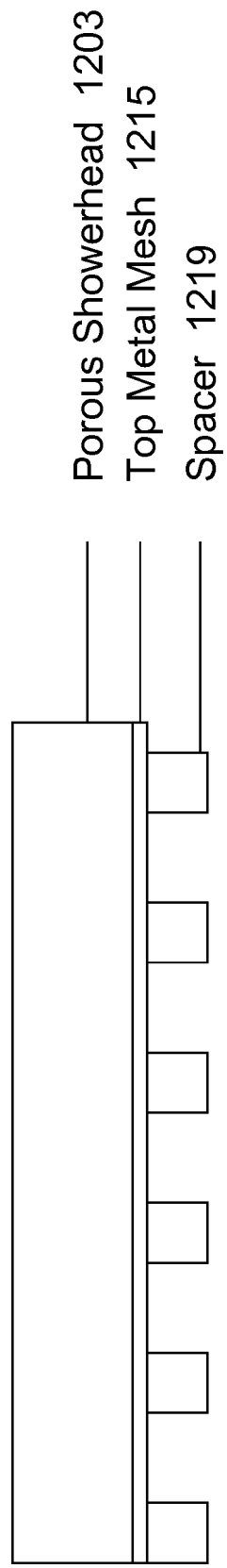
FIG. 12 shows a tool for fabricating a carbon nanotube high frequency transistor.

FIG. 12 shows a tool for fabricating a carbon nanotube high frequency transistor. In a specific implementation, the tool is porous showerhead 1203 which is on top metal mesh 1215. There is a spacer 1219 below the top metal mesh. The tool is shown in connection with the top metal mesh but may be used for other thin layers such as the middle metal mesh.

This tool is used to minimize the top and middle meshes from deforming during synthesis. During fabrication, at high temperature or under some conditions, the top and middle meshes may tend to warp since they are relatively thin. The tool will add mechanical strength to the mesh layers to prevent warping or other deformation during manufacture of a transistor or other semiconductor device. Through holes of the porous showerhead, fluids (including liquids and gases) may flow that are used to form the devices. The voltage used to create the electric field can be applied to the top metal mesh while this mesh is connected to the showerhead.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. A method comprising:
providing a substrate;
forming a base metal layer on the substrate;
forming a catalyst layer on the base metal layer;
providing a middle mesh layer, above the catalyst layer and electrically isolated from the base metal layer;
providing a top mesh layer, above the middle mesh layer and electrically isolated from the middle mesh layer and base metal layer;
applying an electrical potential to create an electric field between the base metal layer and top mesh layer;
in the presence of the electric field, forming carbon nanotubes, perpendicular to a surface of the base metal layer, extending from the catalyst layer through the middle mesh layer;
forming an insulator layer to insulate the carbon nanotubes, middle mesh layer, catalyst layer, and base metal layer; and
forming gate regions between the carbon nanotubes.

2. The method of claim 1 wherein before forming the gate regions, the method comprises removing undesirable carbon nanotubes.

3. The method of claim 1 wherein after forming the gate regions, the method comprises removing undesirable carbon nanotubes.

4. The method of claim 1 wherein the middle mesh layer electrically couples the carbon nanotubes.

5. The method of claim 1 wherein the base metal layer comprises at least one of gold, titanium, palladium, platinum, aluminum, or metal.

6. The method of claim 1 wherein the catalyst layer comprises at least one of iron, nickel, or cobalt.

7. A method comprising:
forming a plurality of pores in a template, each pore having a pore diameter;
exposing the template having pores to a hydrocarbon gas at a temperature to form a first plurality of carbon nanotubes in the pores, each carbon nanotube having an outer diameter less than the pore diameter in the template in which the carbon nanotube is produced;
forming a first electrode region to electrically couple to first ends of the carbon nanotubes;
forming a second electrode region to electrically couple to second ends of the carbon nanotubes;
forming first and second trenches in the template;
forming a first insulator layer in the first trench;
forming a second insulator layer in the second trench;
forming a first gate electrode on the first insulator layer in the first trench;
forming a second gate electrode on the second insulator layer in the second trench, wherein between the first and second gate electrodes are at least two carbon nanotubes in the template;
creating an electric field between the first electrode region and a region above the first electrode region; and
forming a second plurality of carbon nanotubes above the first electrode region in the presence of the electric field.

8. The method of claim 7 wherein the template comprises an alumina material.

9. The method of claim 7 wherein the forming a plurality of pores in a template, each pore having a pore diameter comprises:
anodizing an aluminum material to produce an alumina template with a plurality of pores, each having a pore diameter.

10. A method comprising:
forming a base metal layer;
providing a middle mesh layer, above a catalyst layer and electrically isolated from the base metal layer;
providing a top mesh layer, above the middle mesh layer and electrically isolated from the middle mesh layer and base metal layer;
applying an electrical potential to create an electric field between the base metal layer and top mesh layer; and
in the presence of the electric field, forming carbon nanotubes in the direction of the electric field, extending from the base metal layer through the middle mesh layer.

11. The method of claim 10 comprising:
forming an insulator layer to insulate the carbon nanotubes, middle mesh layer, catalyst layer, and base metal layer; and
forming gate regions between the carbon nanotubes.

12. The method of claim 10 comprising:
forming a catalyst layer on the base metal layer.

13. The method of claim 10 wherein the base metal layer is formed on a substrate, which is a different material from the base metal layer.

14. The method of claim 10 wherein the base metal layer is formed on a substrate, the substrate comprising a porous template comprising nanotubes.

15. The method of claim 10 wherein when the electric field is created, the middle mesh layer is floating.

16. The method of claim 11 wherein the insulator comprises at least one of silicon oxide, silicon nitride, aluminum oxide, titanium oxide, plastic, cellulose, nitrocellulose, polycarbonate, polystyrene, polyethylene, polypropylene, polyvinyl chloride, or polyethylene terephthalate.

17. The method of claim 10 wherein the mesh layers are conductive.

18. The method of claim 10 wherein the middle mesh layer is a porous alumina template.

19. The method of claim 10 wherein the middle mesh layer is insulated from the base metal layer.

20. The method of claim 10 wherein an orientation of the electric field is angled with respect to the base metal layer at an angle less than about 80 degrees.

* * * * *